(12) United States Patent
Kothari et al.

(10) Patent No.: US 7,161,094 B2
(45) Date of Patent: *Jan. 9, 2007

(54) MODIFYING THE ELECTRO-MECHANICAL BEHAVIOR OF DEVICES

(75) Inventors: Manish Kothari, Redwood City, CA (US); Clarence Chui, San Mateo, CA (US); Lauren Palmateer, San Francisco, CA (US)

(73) Assignee: IDC, LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/436,345

(22) Filed: May 18, 2006

(65) Prior Publication Data
US 2006/0219435 A1    Oct. 5, 2006

Related U.S. Application Data

(63) Continuation of application No. 10/839,307, filed on May 4, 2004, now Pat. No. 7,060,895.

(51) Int. Cl.
*H01L 23/18* (2006.01)

(52) U.S. Cl. ................. 174/539; 174/564; 174/565; 257/678; 257/682; 257/700

(58) Field of Classification Search .......... 174/520, 174/521, 539, 542, 559, 564, 565, 52.2, 52.4; 257/678, 682, 700, 701, 702, 729; 438/48, 438/49, 106, 107; 361/139

See application file for complete search history.

(56) References Cited

U.S. PATENT DOCUMENTS

| 2,534,846 | A |   | 12/1950 | Ambrose et al. |
| 3,439,973 | A |   | 4/1969 | Paul et al. |
| 3,443,854 | A |   | 5/1969 | Marks |
| 3,586,926 | A | * | 6/1971 | Nakamura et al. .......... 257/682 |
| 3,653,741 | A |   | 4/1972 | Marks |
| 3,656,836 | A |   | 4/1972 | de Cremoux et al. |
| 3,813,265 | A |   | 5/1974 | Marks |
| 3,955,880 | A |   | 5/1976 | Lierke |
| 4,036,360 | A |   | 7/1977 | Deffeyes |
| 4,074,480 | A |   | 2/1978 | Burton |
| 4,099,854 | A |   | 7/1978 | Decker et al. |

(Continued)

FOREIGN PATENT DOCUMENTS

EP    1418154 A2    12/2004

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—Dean A. Reichard
*Assistant Examiner*—Adolfo Nino
(74) *Attorney, Agent, or Firm*—Knobbe, Martens, Olson & Bear LLP (57) ABSTRACT

A MEMS device is packaged with a control material that is included in the package to affect an operation of a moveable element of the device. The control material may affect operational characteristics including actuation and release voltages and currents, mechanical affects including damping and stiffness, lifetime of the device, optical properties, thermal affects and corrosion. The control material may be inserted into the package as part of any of several structural components of the package or the MEMS device.

33 Claims, 3 Drawing Sheets

U.S. PATENT DOCUMENTS

| | | |
|---|---|---|
| 4,228,437 A | 10/1980 | Shelton |
| 4,377,324 A | 3/1983 | Durand et al. |
| 4,389,096 A | 6/1983 | Hori et al. |
| 4,403,248 A | 9/1983 | te Velde |
| 4,431,691 A | 2/1984 | Greenlee |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,954,789 A | 9/1990 | Sampsell |
| 4,956,619 A | 9/1990 | Hornbeck |
| 4,977,009 A | 12/1990 | Anderson et al. |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,244,707 A | 9/1993 | Shores |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,304,419 A | 4/1994 | Shores |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,591,379 A | 1/1997 | Shores |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |
| 5,636,052 A | 6/1997 | Arney et al. |
| 5,646,768 A | 7/1997 | Kaeriyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,703,710 A | 12/1997 | Brinkman et al. |
| 5,710,656 A | 1/1998 | Goosen |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |
| 5,825,528 A | 10/1998 | Goosen |

| Patent Number | Date | Inventor(s) |
|---|---|---|
| 5,835,255 A | 11/1998 | Miles |
| 5,842,088 A | 11/1998 | Thompson |
| 5,853,662 A | 12/1998 | Watanabe |
| 5,912,758 A | 6/1999 | Knipe et al. |
| 5,936,758 A | 8/1999 | Fisher et al. |
| 5,939,785 A | 8/1999 | Klonis et al. |
| 5,986,796 A | 11/1999 | Miles |
| 6,028,690 A | 2/2000 | Carter et al. |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,061,075 A | 5/2000 | Nelson et al. |
| 6,099,132 A | 8/2000 | Kaeriyama |
| 6,113,239 A | 9/2000 | Sampsell et al. |
| 6,147,790 A | 11/2000 | Meier et al. |
| 6,160,833 A | 12/2000 | Floyd et al. |
| 6,180,428 B1 | 1/2001 | Peeters et al. |
| 6,201,633 B1 | 3/2001 | Peeters et al. |
| 6,226,890 B1 | 5/2001 | Boroson et al. |
| 6,232,936 B1 | 5/2001 | Gove et al. |
| 6,238,755 B1 | 5/2001 | Harvey et al. |
| 6,282,010 B1 | 8/2001 | Sulzbach et al. |
| 6,295,154 B1 | 9/2001 | Laor et al. |
| 6,323,982 B1 | 11/2001 | Hornbeck |
| 6,379,988 B1 | 4/2002 | Peterson et al. |
| 6,392,144 B1 | 5/2002 | Filter et al. |
| 6,447,126 B1 | 9/2002 | Hornbeck |
| 6,465,355 B1 | 10/2002 | Horsley |
| 6,466,358 B1 | 10/2002 | Tew |
| 6,472,739 B1 | 10/2002 | Wood et al. |
| 6,473,274 B1 | 10/2002 | Maimone et al. |
| 6,474,138 B1 | 11/2002 | Chang et al. |
| 6,480,177 B1 | 11/2002 | Doherty et al. |
| 6,496,122 B1 | 12/2002 | Sampsell |
| 6,545,335 B1 | 4/2003 | Chua et al. |
| 6,548,908 B1 | 4/2003 | Chua et al. |
| 6,549,338 B1 | 4/2003 | Wolverton et al. |
| 6,551,838 B1 | 4/2003 | Santini et al. |
| 6,552,840 B1 | 4/2003 | Knipe |
| 6,574,033 B1 | 6/2003 | Chui et al. |
| 6,589,625 B1 | 7/2003 | Kothari et al. |
| 6,590,157 B1 | 7/2003 | Boroson et al. |
| 6,600,201 B1 | 7/2003 | Hartwell et al. |
| 6,606,175 B1 | 8/2003 | Sampsell et al. |
| 6,625,047 B1 | 9/2003 | Coleman, Jr., deceased |
| 6,630,786 B1 | 10/2003 | Cummings et al. |
| 6,632,698 B1 | 10/2003 | Ives |
| 6,643,069 B1 | 11/2003 | Dewald |
| 6,650,455 B1 | 11/2003 | Miles |
| 6,661,084 B1 | 12/2003 | Peterson et al. |
| 6,666,561 B1 | 12/2003 | Blakley |
| 6,674,090 B1 | 1/2004 | Chua et al. |
| 6,674,159 B1 | 1/2004 | Peterson et al. |
| 6,674,562 B1 | 1/2004 | Miles |
| 6,680,792 B1 | 1/2004 | Miles |
| 6,696,645 B1 | 2/2004 | Margomenos et al. |
| 6,710,908 B1 | 3/2004 | Miles et al. |
| 6,740,145 B1 * | 5/2004 | Boroson et al. ..... 257/E23.137 |
| 6,741,377 B1 | 5/2004 | Miles |
| 6,741,384 B1 | 5/2004 | Martin et al. |
| 6,741,503 B1 | 5/2004 | Farris et al. |
| 6,747,785 B1 | 6/2004 | Chen et al. |
| 6,775,174 B1 | 8/2004 | Huffman et al. |
| 6,778,155 B1 | 8/2004 | Doherty et al. |
| 6,787,897 B1 | 9/2004 | Geefay et al. |
| 6,794,119 B1 | 9/2004 | Miles |
| 6,811,267 B1 | 11/2004 | Allen et al. |
| 6,819,469 B1 | 11/2004 | Koba |
| 6,822,628 B1 | 11/2004 | Dunphy et al. |
| 6,829,132 B1 | 12/2004 | Martin et al. |
| 6,853,129 B1 | 2/2005 | Cummings et al. |
| 6,855,610 B1 | 2/2005 | Tung et al. |
| 6,859,218 B1 | 2/2005 | Luman et al. |
| 6,861,277 B1 | 3/2005 | Monroe et al. |
| 6,862,022 B1 | 3/2005 | Slupe |
| 6,862,029 B1 | 3/2005 | D'Souza et al. |
| 6,867,896 B1 | 3/2005 | Miles |
| 6,870,581 B1 | 3/2005 | Li et al. |
| 6,876,071 B1 * | 4/2005 | Liu et al. ..................... 257/678 |
| 7,011,986 B1 * | 3/2006 | Daeche et al. ............. 438/106 |
| 7,045,885 B1 * | 5/2006 | Chen et al. ................. 257/678 |
| 2001/0003487 A1 | 6/2001 | MIles |
| 2002/0015215 A1 | 2/2002 | Miles |
| 2002/0024711 A1 | 2/2002 | Miles |
| 2002/0075551 A1 | 6/2002 | Daneman et al. |
| 2002/0075555 A1 | 6/2002 | Miles |
| 2002/0126364 A1 | 9/2002 | Miles |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0108306 A1 | 6/2003 | Whitney et al. |
| 2003/0152872 A1 | 8/2003 | Miles |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2004/0051929 A1 | 3/2004 | Sampsell et al. |
| 2004/0061492 A1 | 4/2004 | Lopes et al. |
| 2004/0080035 A1 * | 4/2004 | Delapierre .................. 257/682 |
| 2004/0080807 A1 | 4/2004 | Chen et al. |
| 2004/0100677 A1 | 5/2004 | Huibers et al. |
| 2004/0140557 A1 | 7/2004 | Sun et al. |
| 2004/0145049 A1 | 7/2004 | McKinnell et al. |
| 2004/0147056 A1 | 7/2004 | McKinnell et al. |
| 2004/0160143 A1 | 8/2004 | Shreeve et al. |
| 2004/0174583 A1 | 9/2004 | Chen et al. |
| 2004/0179281 A1 | 9/2004 | Reboa |
| 2004/0184133 A1 | 9/2004 | Su et al. |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0038950 A1 | 2/2005 | Adelmann |
| 2005/0057442 A1 | 3/2005 | Way |
| 2005/0068583 A1 | 3/2005 | Gutkowski et al. |
| 2005/0069209 A1 | 3/2005 | Damera-Venkata et al. |
| 2005/0074919 A1 | 4/2005 | Patel |
| 2005/0253283 A1 | 11/2005 | Dcamp et al. |

FOREIGN PATENT DOCUMENTS

| | | |
|---|---|---|
| WO | WO9530924 | 11/1995 |
| WO | WO9717628 | 5/1997 |
| WO | WO9952006 A2 | 10/1999 |
| WO | WO9952006 A3 | 10/1999 |
| WO | WO03007049 A1 | 1/2003 |
| WO | WO 03/026369 A1 | 3/2003 |
| WO | WO03069413 A1 | 8/2003 |
| WO | WO03073151 A1 | 9/2003 |
| WO | WO04006003 A1 | 1/2004 |
| WO | WO04026757 A2 | 4/2004 |
| WO | WO 05/114294 A1 | 4/2005 |

| | | |
|---|---|---|
| WO | WO 05/110914 | 11/2005 |

OTHER PUBLICATIONS

Aratani et al., "Surface micromachined tuneable interferometer array," Sensors and Actuators, pp. 17-23 (1994).

Conner, "Hybrid Color Display Using Optical Interference Filter Array," SID Digest, pp. 577-580 (1993).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).

Gosch, "West Germany Grabs the Lead in X-Ray Lithography," Electronics, pp. 78-80 (Feb. 5, 1987).

Howard et al., "Nanometer-Scale Fabrication Techniques," VLSI Electronics: Microstructure Science, vol. 5, pp. 145-153, and pp. 166-173 (1982).

Jackson, "Classical Electrodynamics," John Wiley & Sons Inc., pp. 568-573 (date unknown).

Jerman et al., "A Miniature Fabry-Perot Interferometer Fabricated Using Silicon Micromaching Techniques," IEEE Electron Devices Society (1998).

Johnson, "Optical Scanner," Microwave Scanning Antennas, vol. 1, pp. 251-261 (1964).

"Light over Matter," Circle No. 36 (Jun. 1993).

Miles, "A New Reflective FPD Technology Using Interferometric Modulation," The Proceedings of the Society for Information Display (may 11-16, 1997).

Newbreaks, "Quantum-trench devices might operate at terahertz frequencies," Laser Focus World (May 1993).

Oliner, "Radiating Elements and Mutual Coupling," Microwave Scanning Antennas, vol. 2, 131-157 and pp. 190-194 (1966).

Raley et al., "A Fabry-Perot Microinterferometer for Visible Wavelengths," IEEE Solid-State Sensor and Actuator Workshop. Hilton Head, SC, pp. 170-173 (1992).

Sperger et al., "High Performance Patterned All-Dielectric Interference Colour Filter for Display Applications," SID Digest, pp. 81-83 (1994).

Stone, "Radiation and Optics, An Introduction to the Classical Theory," McGraw-Hill, pp. 340-343 (1963).

Walker et al., "Electron-beam-tunable Inteference Filter Spatial Light Modulator," Optics Letters vol. 13, No. 5, pp. 345-347 (May 1988).

Winton, "A novel way to capture solar energy," Chemical Week, pp. 17-18 (May 15, 1985).

Wu et al., "Design of a Reflective Color LCD Using Optical Interference Reflectors," Asia Display '95, pp. 929-931 (Oct. 16, 1995).

Liang, et al., " A Low Temperature Wafer-level hermetic MEMS package using UV curable adhesive" Electronic Components and Technology 2004, pp. 1486-1491.

Moraja, et al., Advanced Getter Solutions at Wafer level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

EP Search Report for EP patent No. 05255700.6 - 2217.

International Search Report and Written Oppinion for PCT/US05/030134.

* cited by examiner

MODIFYING THE ELECTRO-MECHANICAL BEHAVIOR OF DEVICES

CROSS REFERENCE TO RELATED APPLICATIONS

This application is a continuation of, and claims priority to, U.S. patent application Ser. No. 10/839,307, filed May 4, 2004 now U.S. Pat. No. 7,060,895, which is incorporated by reference in its entirety.

BACKGROUND OF THE INVENTION

Microelectromechanical systems (MEMS) typically involve at least one movable element in a self-contained package. For example, spatial light modulators such as interferometric or deflectable, reflective modulators may be contained in a package having a clear window offset from a substrate by a ring or other packaging support. MEMS-based switches may be encased in packages having protective caps offset from a substrate by similar components. Generally, MEMS devices will lie between the substrate and an offset cap or cover, as the devices need room to move when activated by an actuation signal.

This packaging type results in an operating environment for the MEMS devices that needs to be controlled. In many instances, the solution to controlling the environment inside the package involves establishing the environment inside the package and then hermetically sealing it to ensure that the environment remains constant. An example of such a hermetic process is discussed in U.S. Pat. No. 6,589,625, issued Jul. 8, 2003. The process of hermetically sealing packages contributes to the cost of the devices, as well as the complexity of the manufacturing process.

Another accommodation to the package environment is the use of getters. A getter is a material that is inserted into the package environment to adsorb moisture from the devices. A getter may adsorb water as it forms from high temperature operation, or may adsorb other materials that outgas from the operation of the device, as examples.

Control of the humidity of the interior of the package may have dramatic effects on the operation of the devices inside. High humidity may cause problems with stiction, a combination of sticking and friction, while completely dry environments may have other effects.

Other aspects of the environment may cause problems or result in increased performance. For example, reducing the partial pressure inside the package may speed the devices, as any damping effects of air between the movable element and the substrate may be reduced. This may result in increased performance, as the elements may move more quickly than in environments without reduced partial pressure.

SUMMARY OF THE INVENTION

An embodiment provides a device that includes a first surface and a second surface offset from the first surface to form a package. The device of this embodiment further includes at least one movable element within the package having a movable surface to contact another surface. The device of this embodiment further includes an environmental control material inside the package to affect an operation of the movable element.

Another embodiment provides a method of packaging a device, the method including forming at least one movable element on a substrate, enclosing the element and the substrate in a package, and including an environmental control material in the package, where the environmental control material is selected based upon the material's effect on operation of the element.

BRIEF DESCRIPTION OF THE DRAWINGS

The invention may be best understood by reading the disclosure with reference to the drawings, wherein.

DETAILED DESCRIPTION OF THE PREFERRED EMBODIMENT

Microelectromechanical (MEMS) devices include a large class of devices in which mechanical structures come into contact with other structures of a different material. For example, a movable element may contact a surface coated with dielectric. The presence of moisture in these types of MEMS devices may result in altered behaviors that may or may not be desirable.

Figure 1:
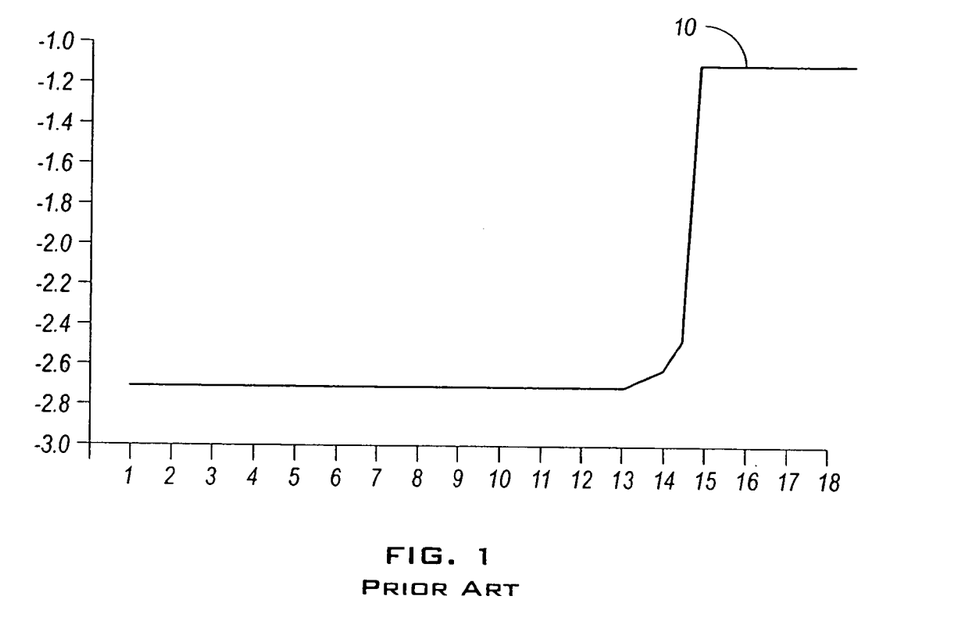
FIG. 1 shows a hysteresis curve of an operating microelectromechanical device.

An example of an undesired behavior occurs when humidity in the device operating environment becomes too high. When the humidity level exceeds a level beyond which surface tension from the moisture becomes higher than the restoration force of a movable element, the movable element may become permanently stuck to the surface. If the humidity level is too low, the moisture charges up to the same polarity as the movable element when the element comes into contact with the coated surface. This may cause a collapse of the hysteresis curve 10 shown in FIG. 1. FIG. 1 shows a typical operating curve for a MEMS device in normal operating conditions.

Figure 2:
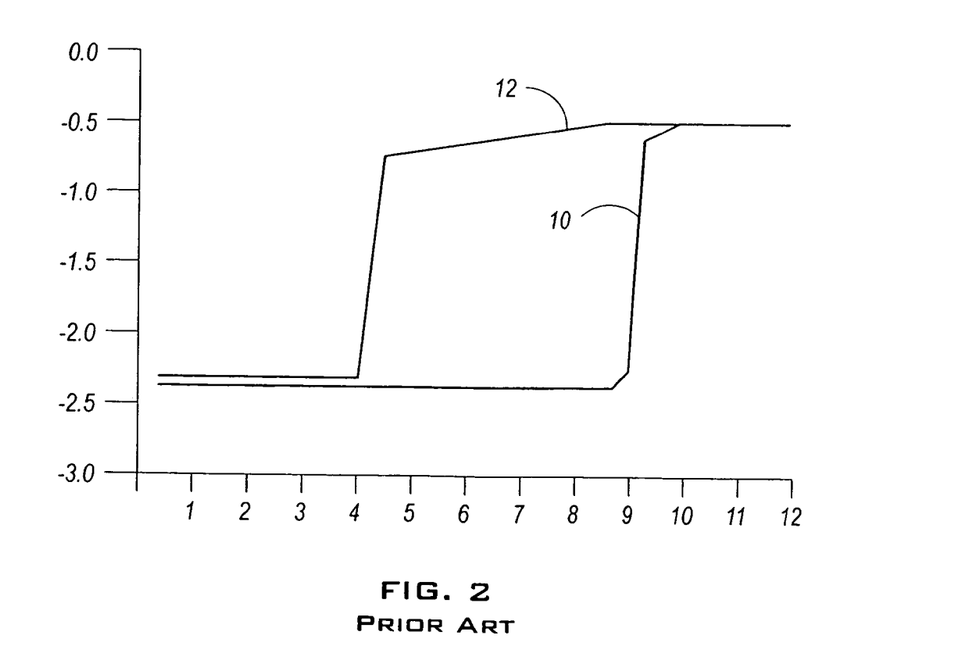
FIG. 2 shows hysteresis curves of operating microelectromechanical devices in different environmental conditions.

If the device is operating in a low moisture or completely dry environment, the device behavior may become dependent upon the design of the device and the materials, such as the movable element and the coated surface coming into contact. This may result in a drastic alteration of the device operating behavior. FIG. 2 compares a device operating in a typical environment, 10, with one operating in a low or no humidity environment 12.

In some instances, depending mostly on the application, these different environments may produce the desired results. In the alternative, they may produce results that are to be avoided. Controlling the environment of the movable element or elements can control the behavior of the elements. This has effects in several different aspects of the operating environment.

For example, the electrical behavior can be altered as discussed above. The amount of charging observed in MEMS devices can be controlled with the amount of moisture, as can the control of electro-static discharge (ESD). The presence or absence of moisture can be controlled to change the actuation voltage, that voltage which causes the movable element to move from an initial position. The release voltage, that voltage which causes the movable element to release from its actuated position, may also be controlled, or controlled instead of the actuation voltage. The amount of voltage needed to switch a MEMS device also relates to the amount of current needed to run the device. A change in the switching voltage may lead to a change in the current consumption of the device.

Mechanical affects may be controlled as well. Different environment control materials can change the partial pressure of gases inside the package. This can change the mechanical response times of the movable element. In MEMS devices, the gaps between the mechanical membranes and the substrate result in movement resistance similar to that of the mean free path of air. Reducing the partial pressure linearly decreases the damping and may result in a significant decrease in the time it takes for the movable element to achieve its actuated state.

In addition, the mechanical stiffness of the structural film may be altered. Controlling the humidity inside the package may cause the film to oxidize, changing its mechanical stiffness. The altered mechanical stiffness may alter the response time or release time of the movable element.

The general properties of the device can be altered as well. The lifetime of the device may be tailored, for example. In one scenario, a device could fail after exposure to $CO_2$. If the device is intended to last 5 years, the $CO_2$ adsorption can be controlled. Assume the permeation rate of $CO_2$ is (X) grams/square meter/24 hours. If A is an area through which $CO_2$ can permeate, an environmental control material having a pore size of 5 A may be selected. The total amount of $CO_2$ adsorbed by the material by Y, where Y is between 0 and 1. The formula for how much environmental control material to be placed in the package becomes:

$$(X*5*365*24*A)/Y.$$

For MEMS devices used in optical applications, such as photo electronic switches or display elements, the optical properties may be controlled as well. One example may involve a material placed in the device to cause the formation of aluminum oxide on the surfaces of the movable elements in the presence of moisture, thereby changing the optical properties of the device.

The environmental control material may alter the thermal effects as well. In one example, a device that is normally packaged by hermetic sealing of the device in a vacuum. Dissipation of heat only occurs by radiation. Using an environmental control material that has good convection heat dissipation, no further hermetic sealing or vacuums are necessary. The environmental control material could be comprised of several different materials capable of adsorbing different molecular sizes, or different materials, such as water, oxygen and nitrogen. Regeneration of the environmental control material may also be controlled inside the package.

Other aspects of the device that can be controlled by the environmental control material include corrosion. Oxidation in presence of moisture and formation of an acidic environment can damage the elements. For example, chlorine may outgas from the device at high temperatures. When combined with moisture, hydrochloric acid may form that may damage the device. This effect can be avoided by the selection of the environmental control material.

Figure 3:
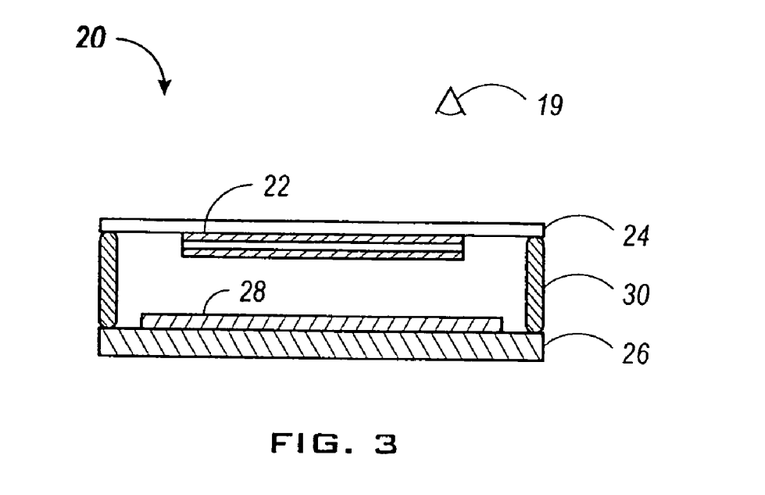
FIG. 3 shows one embodiment of a device package for a microelectromechanical device including an environmental control material.

Once selected, the environmental control material can be inserted either into the device package or a module package. A device package 20 is shown in FIG. 3. The MEMS device 22 is shown as a layer of thin films, merely as an example, formed on a substrate 24. In this particular example, the device is a display device, using interferometric effects to form images from incident light. The interferometric modulator elements are formed of a movable element that comes into contact with another surface, such as the substrate or part of the thin film stack shown. The viewer 19 would see the images formed by the modulator through the substrate 24. A back plate, or second surface, 26 may be offset and joined to the substrate 24, the first surface, by sides 30 comprising a joining material that forms the package. Alternatively, the back plate may be formed of a structure having a second surface 26 and sides 30, where the back plate 26 and the sides 30 would be one unit. This forms a recessed back plate to accommodate the modulator. The environmental control material 28 is inserted in the package to cause or avoid the effects as discussed above.

Figure 4:
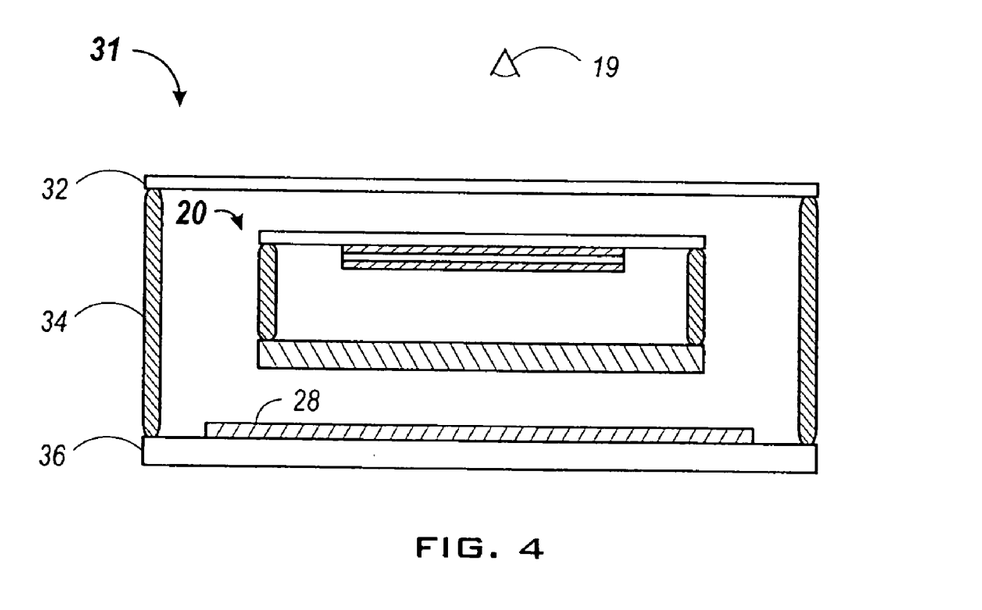
FIG. 4 shows one embodiment of a module package for a microelectromechanical device including an environment control material.

In an alternative embodiment, the environmental control material can be inserted into a module package, which as defined here is a package in which the device package is contained shown in FIG. 4. The module package 31 has a first surface 32 offset from a second surface 36 by a joining material 34. Inside the module package 31 is the device package 20. The environmental control material 28 is inserted into the module package 31. In addition, the environmental control material can be made part of the package by being made part of the joining material 34, the substrate, or as part of the device manufacture. In one embodiment, the window of the modulator, and the first surface 32 of the module package 31 may be the same surface, or mounted such that they form one structure. In this case, the first surface would be the first surface of both the module package 31 and the device package 20.

Figure 5:
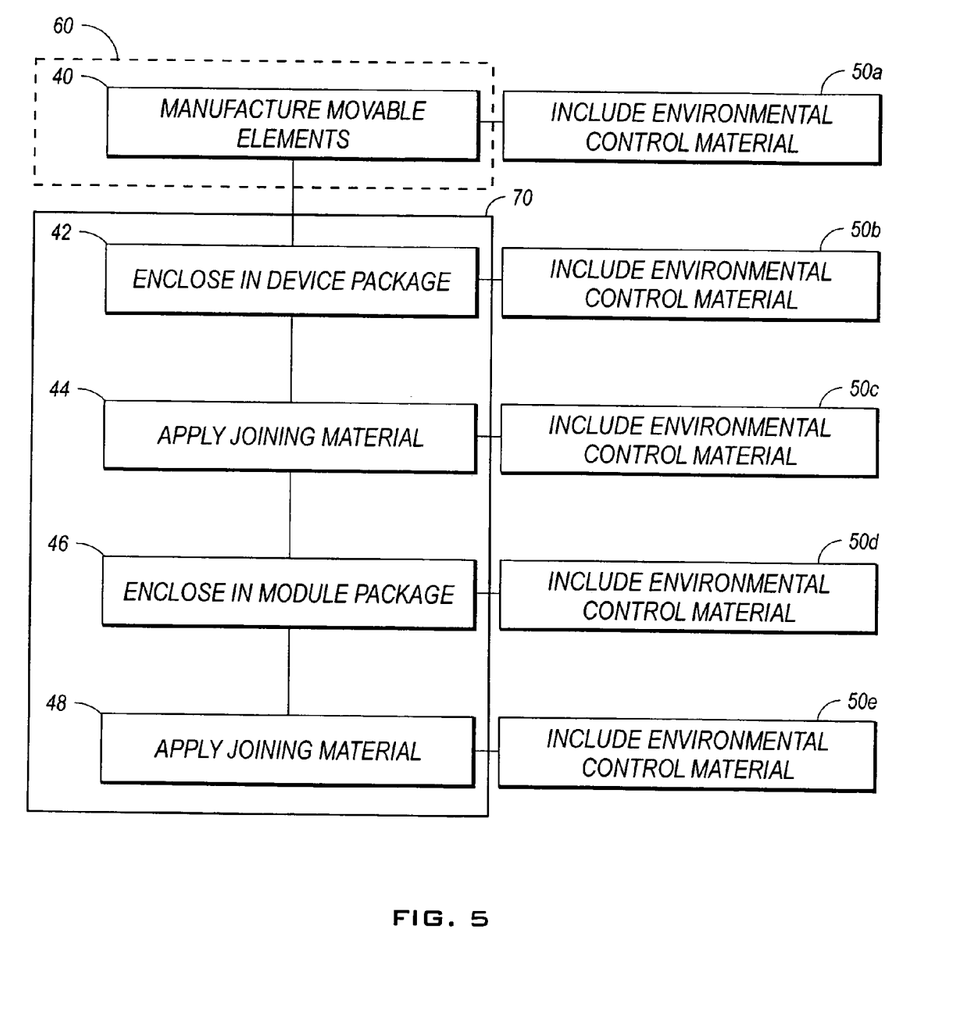
FIG. 5 shows a flowchart of an embodiment to manufacture a microelectromechanical device including an environmental control material.

An embodiment of a manufacturing process is shown in FIG. 5. The process has three basic steps, manufacture of the movable elements, step 60, packaging of the device, step 70 and including the environmental material, steps 50a through 50e. The manufacture of the movable elements, step 40 could include the environmental control material at step 50a. The environmental control material could be made as part of the substrate, the manufacture of the elements themselves or during processing of the various materials during the formation of the elements, such as deposition as thin films.

The packaging process may or may not include a module package. The movable elements are enclosed in the device package, step 42. The including environmental control materials may be included in the device package at step 50b, as discussed before. The joining material is applied at step 44 to form the device package between the first and second surfaces. Again, as mentioned before the environmental control material could be inserted into the package as part of the joining material at step 50c.

If the device is to be enclosed into a module package at step 46, the module package can then have the environmental control materials at step 50d. The joining material is then applied to form the module package at step 48, where the environmental control material may be included at step 50e. The process may include a device package, a module package or both. The packaging process involves joining a first surface or second surface with a joining material, whether that first surface and second surface be a device package or a module package.

The materials used in each portion of the process may vary depending upon the MEMS device and its application, as well as the environmental effect desired. The device package will generally include a substrate and a back plate. The substrate, or first surface of the device or module package, may include glass, plastic, metal, silicon, or ceramic, among others. The back plate, or second surface of the device or the module package, may be glass, plastic, metal, metal foil, silicon, ceramic, fluid, etc. The joining material used in either package may be an epoxy-based adhesive, o-ring sealants, PIBs, poly-urethanes, adhesives with environmental control materials, thin film metal-to-metal welded joints, liquid spin-on glass, solders, or insitu growth of polymers or plastic layers to form seals.

The environmental control materials may be zeolites, which is the common name for sodium aluminosilicate, having various pore sizes, molecular sieves, surface or bulk adsorbents that absorb other molecules on the surface or in the bulk, or dessicants. The environmental control material may be a chemical reactant that reacts with the unwanted material to form an innocuous compound, such as one that adsorbs moisture to form another compound that is inert. The environmental control materials may be fabricated as devices that physically obstruct the leakage of molecules once the environmental control materials get inside the molecules. The molecule sieves could be incorporated into thin films deposited or spun on polymers. The molecular sieves could be sprayed on the surface of the device, or prepared in advance and regenerated prior to use, as well as applied as a dip coat.

In addition to different types of materials and different methods to apply them, the environmental control materials could be of different shapes, sizes and forms. The environmental control material could be a solid, powder that are dumped directly inside the package or mixed with adhesive for application. The materials could be formed into shapes as cylinder, sheets, etc., and then applied inside the package. The material could be screen printed or liquid dispensed inside the package or on the substrate. The application of the material is left up to the system designer.

Thus, although there has been described to this point a particular embodiment for a method and apparatus for MEMS devices having environmental control materials, it is not intended that such specific references be considered as limitations upon the scope of this invention except in-so-far as set forth in the following claims.

What is claimed is:

1. A display device, comprising:
   a package;
   at least one microelectromechanical system (MEMS) device enclosed within the package, the MEMS device comprising a movable element configured to contact another surface; and
   an environmental control material inside the package, wherein the amount of the environmental control material is selected to affect an operation of the MEMS device.

2. The display device of claim 1, wherein the package comprises a first surface and a second surface.

3. The display device of claim 2, wherein the first surface comprises a substrate.

4. The display device of claim 3, wherein the substrate is selected from the group consisting of: glass, plastic, metal, silicon and ceramic.

5. The display device of claim 2, wherein the second surface comprises a back plate.

6. The display device of claim 5, wherein the back plate comprises a material selected from the group consisting of glass, plastic, metal, metal foil, silicon, and ceramic.

7. The display device of claim 2, further comprising a joining material to join the first surface and the second surface of the package.

8. The display device of claim 7, wherein the joining material comprises a material selected from the group consisting of: epoxy-based adhesives, o-rings, PIBs, poly-urethane, adhesives with zeolite incorporated within, thin film metal welds, liquid spin-on glass, solder, grown polymers, and grown plastics.

9. The display device of claim 1, wherein the environmental control material comprises a material selected from the group consisting of: zeolites, molecular sieves, desiccants, surface adsorbents, bulk adsorbents, chemical reactants, and physical obstructers.

10. The display device of claim 9, wherein the molecular sieves are formed by a process selected from the group consisting of: molecular sieves in deposited thin films, molecular sieves in spun on polymers, sprayed on molecular sieves, and regenerated molecular sieves prepared in advance.

11. The display device of claim 1, wherein the environmental control material comprises an environmental control material embedded into the MEMS device.

12. The display device of claim 1, wherein the environmental control material comprises an environmental control material embedded into a component of the package.

13. The display device of claim 1, wherein the operation of the MEMS device comprises movement of the movable element.

14. The display device of claim 1, wherein the operation of the MEMS device comprises contact between the movable element and the another surface.

15. The display device of claim 1, wherein the environmental control material is selected to affect the actuation voltage of the MEMS device.

16. The display device of claim 1, wherein the environmental control material is selected to affect the release voltage of the MEMS device.

17. The display device of claim 1, wherein the environmental control material is selected to affect the partial pressure of gases inside the package.

18. The display device of claim 1, wherein the environmental control material is selected to affect the response time of the MEMS device.

19. The display device of claim 1, wherein the environmental control material is selected to affect the lifetime of the MEMS device.

20. The display device of claim 1, wherein the environmental control material is selected to affect the rate of corrosion of the MEMS device.

21. A method of packaging a display device, comprising:
    forming at least one interferometric modulator on a substrate, the interferormetric modulator comprising a movable surface configured to contact another surface; and
    including an environmental control material, wherein the amount of environmental control material is selected based upon an effect on an operation of the interferometric modulator caused by the material.

22. The method of claim 21, further comprising enclosing the interferometric modulator in a package.

23. The method of claim 22, wherein enclosing the interferometric modulator and the substrate in a package comprises enclosing the interferometric modulator and the substrate in a device package, and wherein including the environmental control material comprises including the environmental control material in the device package.

24. The method of claim 22, wherein enclosing the interferometric modulator and the substrate in a package further comprises enclosing the interferometric modulator and the substrate in a module package, and wherein including the environmental control material comprises including the environmental control material in the module package.

25. The method of claim 22, wherein enclosing the interferometric modulator and the substrate in a package comprises joining the substrate and a back plate with a joining material.

26. The method of claim 22, wherein including the environmental control material comprises adding a powder inside the package.

27. The method of claim 22, wherein including the environmental control material comprises shaping the environmental control material into shapes and applying the shapes inside the package.

28. The method of claim 21, wherein forming at least one interferometric modulator on the substrate comprises forming the interferometric modulator from thin films, and wherein including the environmental control material comprises including the environmental control material embedded in one of the thin films.

29. The method of claim 21, wherein including the environmental control material comprises embedding the environmental control material in the substrate.

30. The method of claim 21, wherein including the environmental control material comprises applying the environmental control material in a spray.

31. The method of claim 21, wherein including the environmental control material comprises applying the environmental control material in a dip coat.

32. The method of claim 21, wherein including the environmental control material comprises applying the environmental control material as a screen print.

33. The method of claim 21, wherein including the environmental control material comprises dispensing the environmental control material in liquid form.

* * * * *

UNITED STATES PATENT AND TRADEMARK OFFICE
CERTIFICATE OF CORRECTION

PATENT NO. : 7,161,094 B2
APPLICATION NO. : 11/436345
DATED : January 9, 2007
INVENTOR(S) : Kothari et al.

It is certified that error appears in the above-identified patent and that said Letters Patent is hereby corrected as shown below:

On the Title Page, Item -56- under U.S. Patent Documents, line 3, delete "Marks" and insert -- Weiss --, therefor.

On the Title Page 3, Item -56- under U.S. Patent Documents, line 10, delete "Miles" and insert -- Miles --, therefor.

On the Title Page 4, Item -56- under Other Publications, line 2, delete "array." and insert -- array, --, therefor.

On the Title Page 4, Item -56- under Other Publications, line 22, delete "Scanner" and insert -- Scanners --, therefor.

On the Title Page 4, Item -56- under Other Publications, line 27, delete "may" and insert -- May --, therefor.

On the Title Page 4, Item -56- under Other Publications, line 28, delete "Newbreaks" and insert -- Newsbreaks --, therefor.

On the Title Page 4, Item -56- under Other Publications, line 4, delete "Workshop." and insert -- Workshop, --, therefor.

On the Title Page 4, Item -56- under Other Publications, line 11, delete "Inteference" and insert -- Interference --, therefor.

On the Title Page 4, Item -56- under Other Publications, line 22, delete "level" and insert -- Level --, therefor.

On the Title Page 4, Item -56- under Other Publications, line 29, delete "Oppinion" and insert -- Opinion --, therefor.

UNITED STATES PATENT AND TRADEMARK OFFICE
CERTIFICATE OF CORRECTION

PATENT NO. : 7,161,094 B2
APPLICATION NO. : 11/436345
DATED : January 9, 2007
INVENTOR(S) : Kothari et al.

It is certified that error appears in the above-identified patent and that said Letters Patent is hereby corrected as shown below:

In column 5, line 12, delete "dessicants" and insert -- desiccants --, therefor.

In column 6, line 49, in Claim 21, delete "interferormetric" and insert

-- interferometric --, therefor.

Signed and Sealed this

Fourteenth Day of August, 2007

JON W. DUDAS
*Director of the United States Patent and Trademark Office*